(12) United States Patent
Hofmann et al.

(10) Patent No.: US 7,344,923 B2
(45) Date of Patent: Mar. 18, 2008

(54) NROM SEMICONDUCTOR MEMORY DEVICE AND FABRICATION METHOD

(75) Inventors: Franz Hofmann, Munich (DE);
Erhard Landgraf, Munich (DE);
Michael Specht, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/282,904

(22) Filed: Nov. 18, 2005

(65) Prior Publication Data

US 2006/0108646 A1    May 25, 2006

Related U.S. Application Data

(63) Continuation of application No. PCT/EP2004/004772, filed on May 5, 2004.

(30) Foreign Application Priority Data

May 30, 2003    (DE)    ................... 103 24 550

(51) Int. Cl.
*H01L 21/82*    (2006.01)

(52) U.S. Cl. .............. 438/128; 438/129; 438/287; 438/589; 438/591; 257/E21.18; 257/E21.423; 257/E21.679

(58) Field of Classification Search ............. 438/128, 438/129, 216, 261, 287, 288, 591, 589; 257/E21.18, 257/E21.21, E21.423, E21.662, E21.679
See application file for complete search history.

(56) References Cited

U.S. PATENT DOCUMENTS

| | | |
|---|---|---|
| 5,851,881 A | 12/1998 | Lin et al. |
| 6,239,465 B1 | 5/2001 | Nakagawa |
| 6,448,607 B1 | 9/2002 | Hsu et al. |
| 6,548,861 B2 * | 4/2003 | Palm et al. ............ 257/330 |
| 6,621,119 B1 * | 9/2003 | Wu ....................... 257/321 |
| 6,989,562 B2 * | 1/2006 | Georgescu ............ 257/315 |

(Continued)

FOREIGN PATENT DOCUMENTS

DE    10204873    10/2003

(Continued)

OTHER PUBLICATIONS

German Office Action dated Jan. 22, 2004.

(Continued)

*Primary Examiner*—Minh-Loan Tran
(74) *Attorney, Agent, or Firm*—Jenkins, Wilson, Taylor & Hunt, P.A.

(57) ABSTRACT

An NROM semiconductor memory device and fabrication method are disclosed. According to one aspect, a method for fabricating an NROM semiconductor memory device can include providing a plurality of u-shaped MOSFETs, which are spaced apart from one another and have a multilayer dielectric. The dielectric suitable for charge trapping along rows in a first direction and alone columns in a second direction in trenches of a semiconductor substrate. Source/drain regions are provided between the u-shaped MOSFETs in interspaces between the rows which run parallel to the columns. Isolation trenches are provided in the source/drain regions between the u-shaped MOSFETs of adjacent columns as far as a particular depth in the semiconductor substrate. The isolation trenches are filled with an insulation material. Word lines are provided for connecting respective rows of u-shaped MOSFETs.

5 Claims, 10 Drawing Sheets

U.S. PATENT DOCUMENTS

| | | | |
|---|---|---|---|
| 7,075,151 B2 * | 7/2006 | Shino | 257/347 |
| 2002/0024092 A1 | 2/2002 | Palm et al. | |

FOREIGN PATENT DOCUMENTS

| | | |
|---|---|---|
| DE | 10240893 | 3/2004 |
| JP | DE 10162975 | 1/2003 |
| WO | WO 03/001600 | 1/2003 |

OTHER PUBLICATIONS

PCT International Search Report dated Oct. 25, 2004.

PCT International Preliminary Examination Report dated Sep. 8, 2005.

* cited by examiner

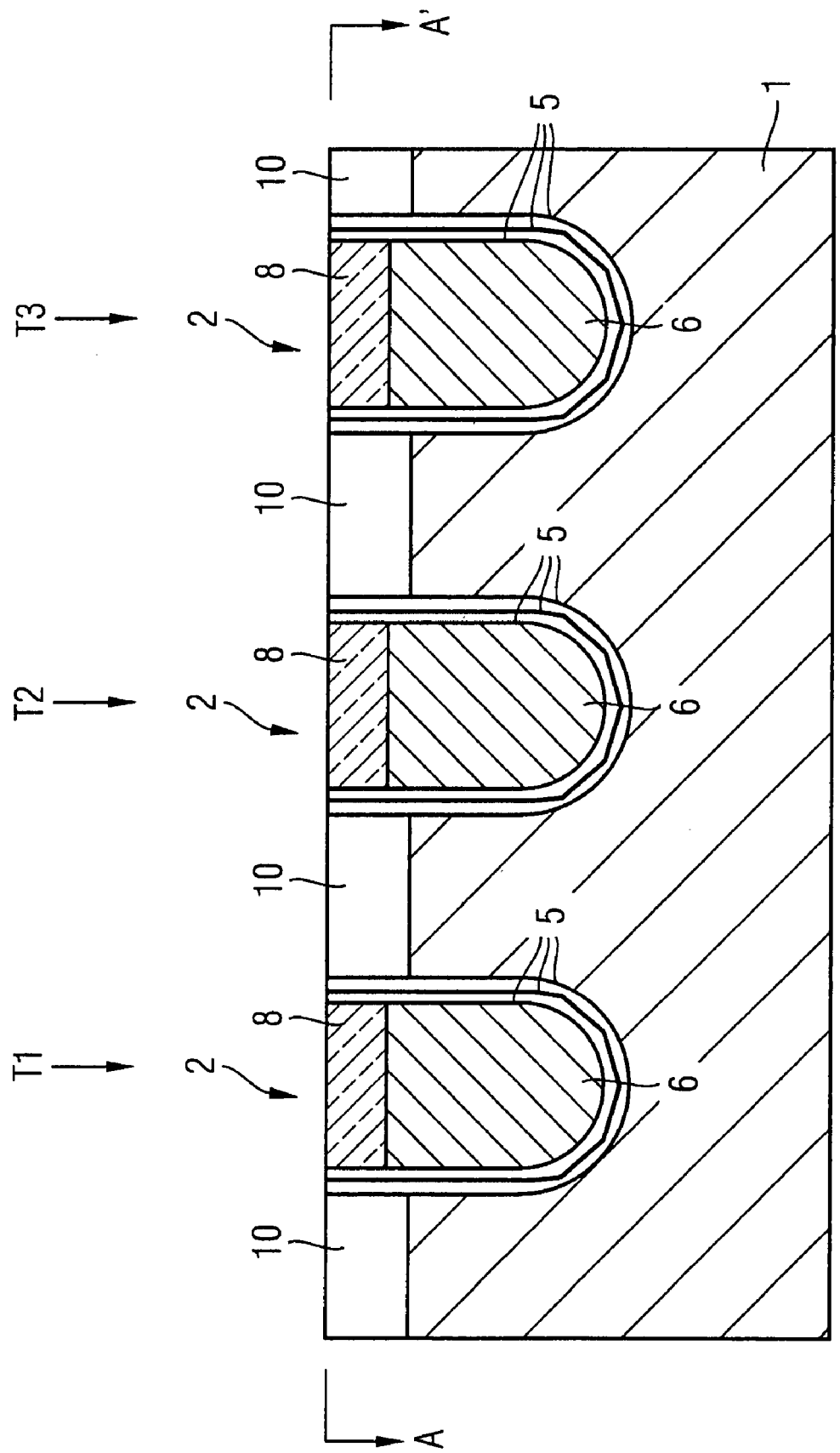

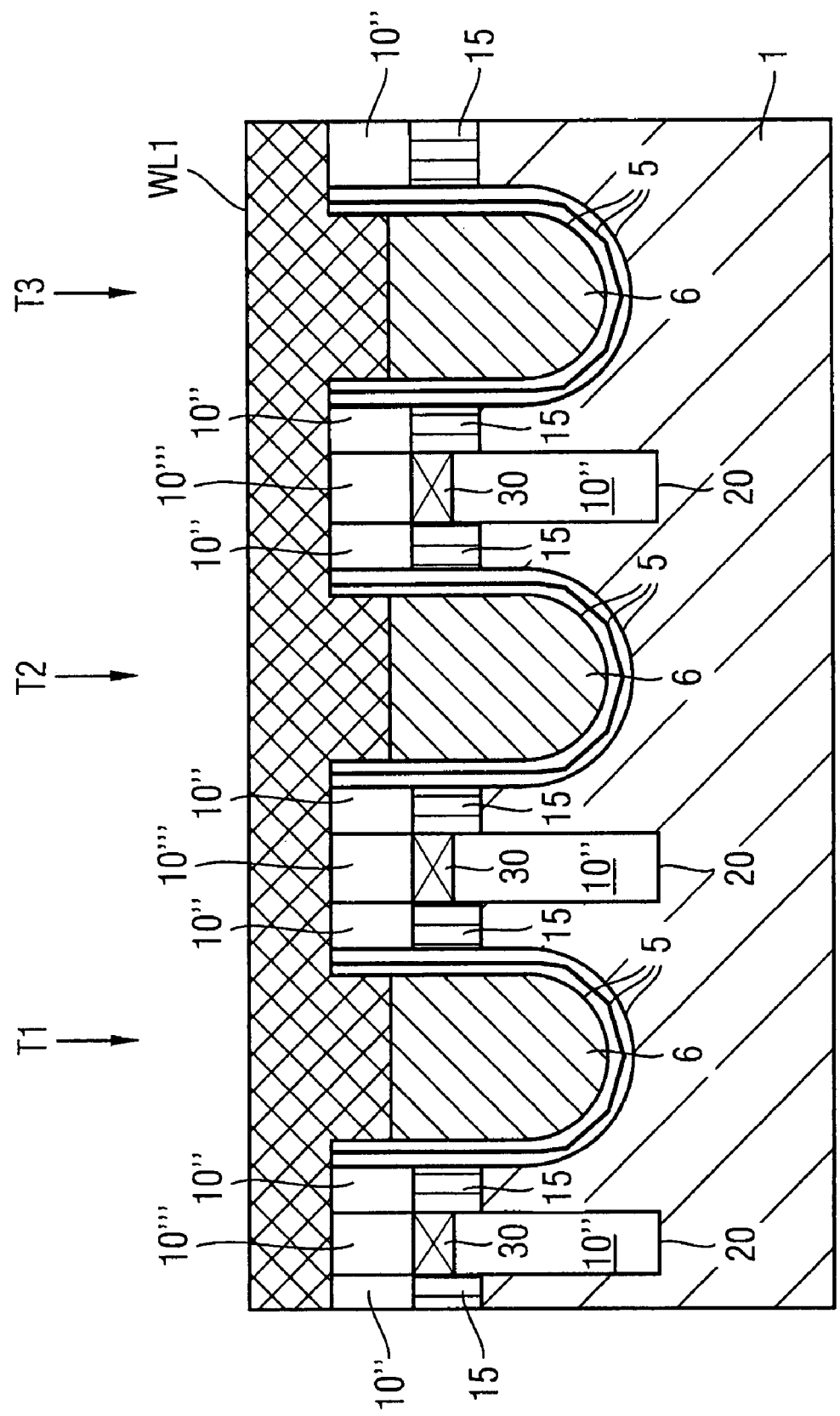

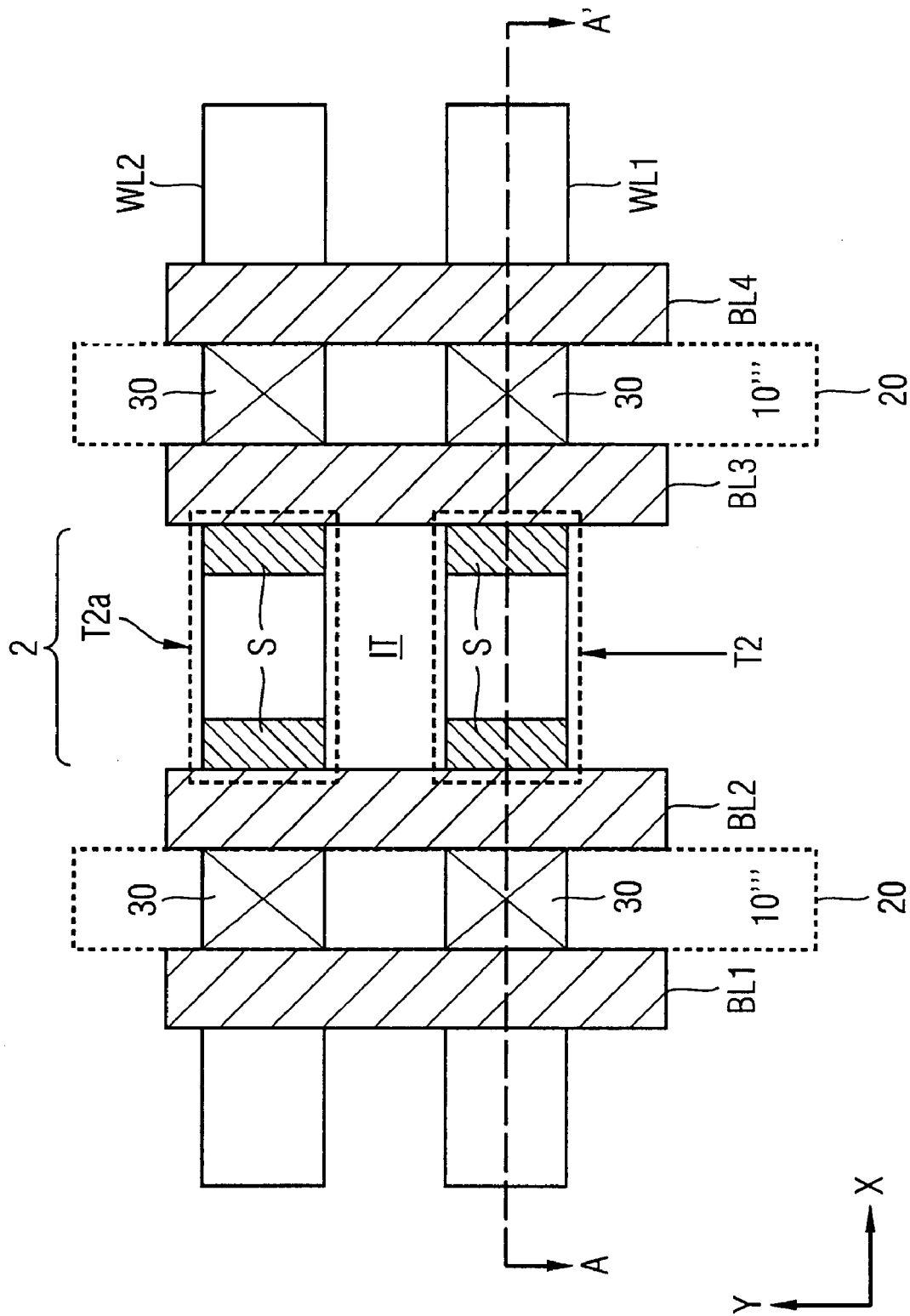

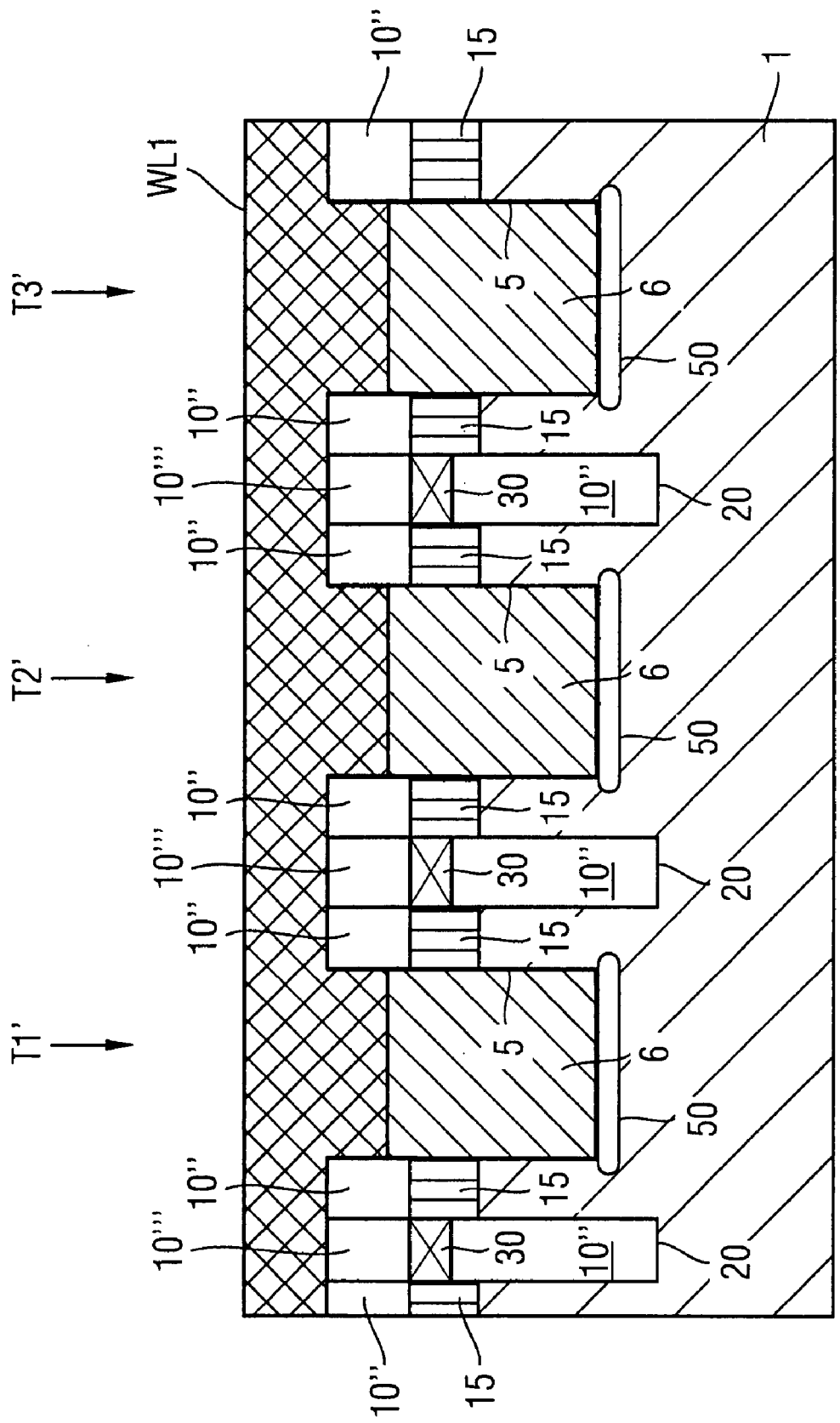

NROM SEMICONDUCTOR MEMORY DEVICE AND FABRICATION METHOD

RELATION APPLICATIONS

This application is a continuation of PCT patent application number PCT/EP2004/004772, filed May 5, 2004, which claims priority to German patent application number 10324550.2, filed May 30, 2003, the disclosures of each of which are incorporated herein by reference in their entirety.

TECHNICAL FIELD

The present invention relates to a method for fabricating an NROM semiconductor memory device and to a corresponding NROM semiconductor memory device.

BACKGROUND ART

NROM semiconductor memory devices (NROM=Nitride Read Only Memory) use inherent physical properties of the oxide-nitride-oxide (ONO) gate dielectric and known programming, reading and erasing mechanisms to provide memory cells having two bits per cell. The storage density in NROM semiconductor memory devices is thus twice as high as in conventional EEPROM semiconductor memory devices.

FIG. 4 shows a known NROM semiconductor memory device.

In FIG. 4, reference symbol 1 denotes a p⁻-type semiconductor substrate, reference symbol S denotes an n⁺-type source region, reference symbol D denotes an n⁺-type drain region, reference symbol FO denotes field oxide regions, reference symbol DD denotes an ONO triple dielectric, reference symbol WL denotes a word line as a gate connection, reference symbols B1 and B2 respectively denote a first and a second bit, and reference symbol LC denotes local charge accumulation regions corresponding to the bits B1 and B2.

An NROM semiconductor memory device of this type is described, for example, in B. Eitan, IEEE Electronic Device Letters 21, pages 543 ff, 2000.

The memory cell shown is an n-channel MOSFET in which the gate dielectric is an ONO triple dielectric DD. In order to form the bits B1 and B2, narrowly distributed charge accumulations in the two charge accumulation regions LC in the nitride may be programmed, read and erased. In this case, the localized charge distributions are produced such that they are themselves aligned with the edges of the channel. The NROM memory cell is programmed by injecting hot electrons. Typical programming voltages are $V_{DS}=5$ V between the drain and the source and $V_G=9$ V at the gate.

A method for fabricating an NROM semiconductor memory device of this type is disclosed, for example, in EP 1 073 120 A2.

The fact that a punch-through between the drain D and the source S of the respective MOSFET can occur when there are excessively high voltages at the drain, in particular if the transistor has a short channel length of typically less than 250 nm, has proved to be disadvantageous in these known NROM memory cells.

FIG. 5 shows another known an NROM semiconductor memory device.

This NROM semiconductor memory device is described in the earlier German application DE 102 04 873.8. In contrast to the NROM semiconductor memory device shown in FIG. 4, the MOSFETs are u-shaped in this case, thus allowing the undesirable tendency to a punch-through to be reduced since the channel length is longer than in the planar transistor for the same amount of area taken up.

In particular, in FIG. 5, T1", T2", T3" denote a first, second and third u-shaped MOSFET. I denotes TEOS isolation regions, and G denotes a polysilicon gate which is connected to a word line WL made of tungsten.

However, initial measurements on NROM semiconductor memory devices of this type have revealed that, in this case, the problem of a punch-through from one transistor to an adjacent transistor can arise, as indicated in FIG. 5 by the arrow PT between the transistors T1" and T2". This punch-through occurs, in particular, when the distance between the adjacent transistors becomes smaller and smaller. The punch-through stems from the fact that the two transistors are at the same potential on account of the common word line. In addition, a punch-through between the channels may occur, thus reducing the production of channel hot electrons.

SUMMARY OF THE INVENTION

Therefore, it is an object of the present invention to provide a method for fabricating an NROM semiconductor memory device and a corresponding NROM semiconductor memory device which, despite further miniaturization, do not have the punch-through problems mentioned.

According to the invention, this problem is solved by the fabrication method specified in claim 1 and by the NROM semiconductor memory device specified in claim 7.

The idea on which the present invention is based involves introducing a concomitantly filled isolation trench between two adjacent u-MOSFETs. A special process sequence can be used to produce the isolation trench in a self-aligned manner. The isolation trench prevents the punch-through between the adjacent transistors and can be set in accordance with the conditions using the depth of the trench. In addition, the isolation trench prevents undesirable injection of hot electrons into the adjacent transistors.

In principle, the punch-through could be reduced by means of higher doping of the silicon between the u-MOSFETS. However, the threshold voltage of the u-MOSFETS is considerably increased in this case. In contrast thereto, the isolation trenches can be used to set the threshold voltage of the u-MOSFETs independently of the solution to the punch-through problem.

Advantageous developments of, and improvements to, the respective subject matter of the invention can be found in the subclaims.

In accordance with one preferred development, the following steps are carried out: a hard mask is used to form the trenches as longitudinal trenches corresponding to respective columns of u-shaped MOSFETs; the multilayer dielectric is formed on the trench walls; the trenches are partially filled with a gate electrode material; the trenches are closed with an insulation cover which is flush with the surface of the hard mask; the insulation cover, the gate electrode material and the multilayer dielectric are removed from the trench walls and isolation regions are formed in order to separate the individual u-shaped MOSFETs along the columns.

In accordance with another preferred development, the following steps are carried out: openings are formed in the hard mask in the interspaces in order to expose the semiconductor substrate, sidewall spacers remaining as a mask above the semiconductor substrate next to the trenches; ions are implanted through the openings and subsequent diffusion is carried out in order to form the source/drain regions; the isolation trenches are etched through the openings.

In accordance with another preferred development, the bit lines of adjacent MOSFETs are electrically connected in pairs by providing conductive straps in the isolation trenches. In the case of isolation trenches without this conductive strap, the resistance of the bit lines could, under certain circumstances, increase to such an extent that programming using channel hot electrons is greatly impeded or even becomes impossible.

In accordance with another preferred development, the trenches are rounded in the lower trench region before the multilayer dielectric is formed on the trench walls.

In accordance with another preferred development, the trenches are configured in an angular manner in the lower trench region, and, before the multilayer dielectric is formed on the trench walls, ions are implanted into the trenches using the hard mask and subsequent implantation is carried out in order to form channel blocking regions in the semiconductor substrate under the trenches. In this other preferred development, the channel blocking regions have the effect that no undesirable field strength effects occur at the corners of these angular u-MOSFETs.

Exemplary embodiments of the invention are illustrated in the drawings and are explained in more detail in the following description.

BRIEF DESCRIPTION OF THE DRAWINGS

FIGS. 1a-f show diagrammatic illustrations of successive method stages of a method for fabricating an NROM semiconductor memory device as a first embodiment of the present invention;

FIG. 2 shows a plan view of a cell array having an NROM semiconductor memory device in accordance with the first embodiment of the present invention;

FIG. 3 shows an NROM semiconductor memory device as a second embodiment of the present invention;

DETAILED DESCRIPTION OF THE INVENTION

Figure 1B:
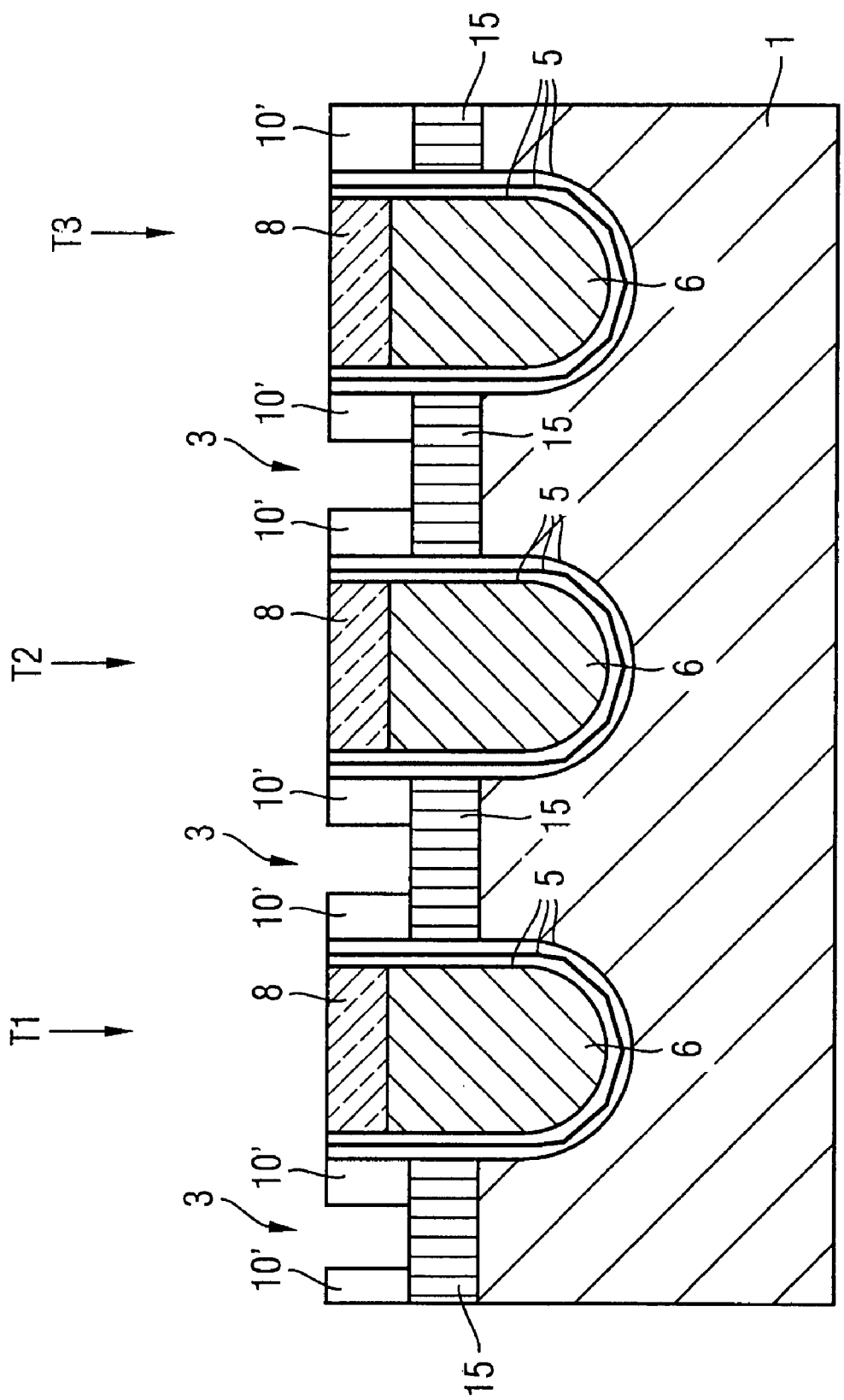

In the figures, identical reference symbols denote identical or functionally identical components.

FIGS. 1a-f show diagrammatic illustrations of successive method stages of a method for fabricating an NROM semiconductor memory device as a first embodiment of the present invention, and FIG. 2 shows a plan view of a cell array having an NROM semiconductor memory device in accordance with the first embodiment of the present invention.

In FIG. 1a, 1 denotes a p⁻-type silicon semiconductor substrate on which is situated a hard mask 10 which is made of silicon oxide and has been used to produce transistor trenches 2 (which have a rounded lower trench region) in the substrate 1. Reference symbol 5 denotes the ONO triple dielectric which is situated on the trench walls and on the trench bottom, reference symbol 6 denotes a partial polysilicon filling as a gate, which has been produced by deposition, chemical mechanical polishing and etching back, and reference symbol 8 denotes covers which are made of silicon nitride and have likewise been produced by deposition and subsequent chemical mechanical polishing.

In FIG. 1a, T1, T2, T3 denote a first, second and third u-MOSFET which are, however, not separated in the y-direction until later.

As illustrated in the plan view of the cell structure shown in FIG. 2, the transistor trenches are adjacent to one another in the x-direction and run in a parallel manner over the substrate 1 in the y-direction.

With reference to FIG. 1b, a photolithographic process takes place next in order to form, from the hard mask regions 10 made of silicon oxide, sidewall spacer regions 10' which are made of silicon oxide and have openings 3 which are in the center between two respective adjacent u-MOSFETs.

The oxide 10 is removed from the array using phototechnology. The photoresist is then removed. An oxide or nitride having the thickness "width of 10'" is then deposited, the distance between the u-trenches being given as "3×width of 10'". Spacer etching of the oxide or nitride is carried out as the next step, the spacer 10' made of oxide or nitride now being produced.

In a subsequent process step, n⁺-type implantation and subsequent diffusion in order to form the source/drain regions 15 between the u-MOSFETs take place using this oxide spacer 10' as a mask.

Figure 1C:
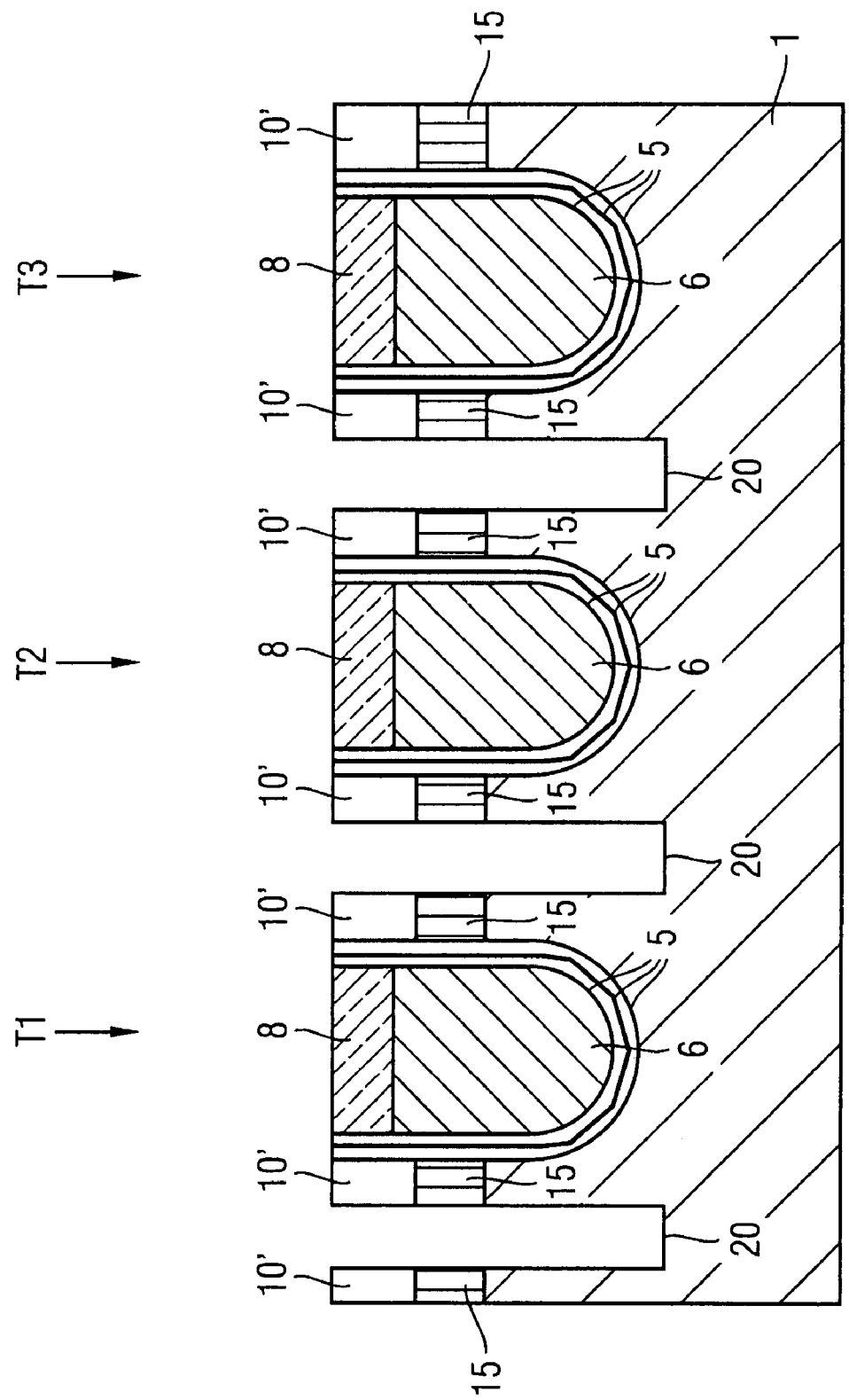

As illustrated in FIG. 1c, silicon etching is then effected using the oxide spacers 10' and the nitride covers 8 as a hard mask in order to form isolation trenches 20 between the adjacent u-MOSFETs. Providing isolation trenches 20 in the source/drain regions 15 between the u-shaped MOSFETs of adjacent columns as far as a particular depth in the semiconductor substrate 1 cuts the source/drain regions 15 into respective bit lines BL1-BL4, as can be gathered from FIG. 2.

In a subsequent process step, the oxide spacers 10' or nitride spacers are removed. A thin sidewall oxide (not shown) is then optionally provided on the walls of the isolation trenches 20, said sidewall oxide being intended to prevent any leakage currents there.

Figure 1D:
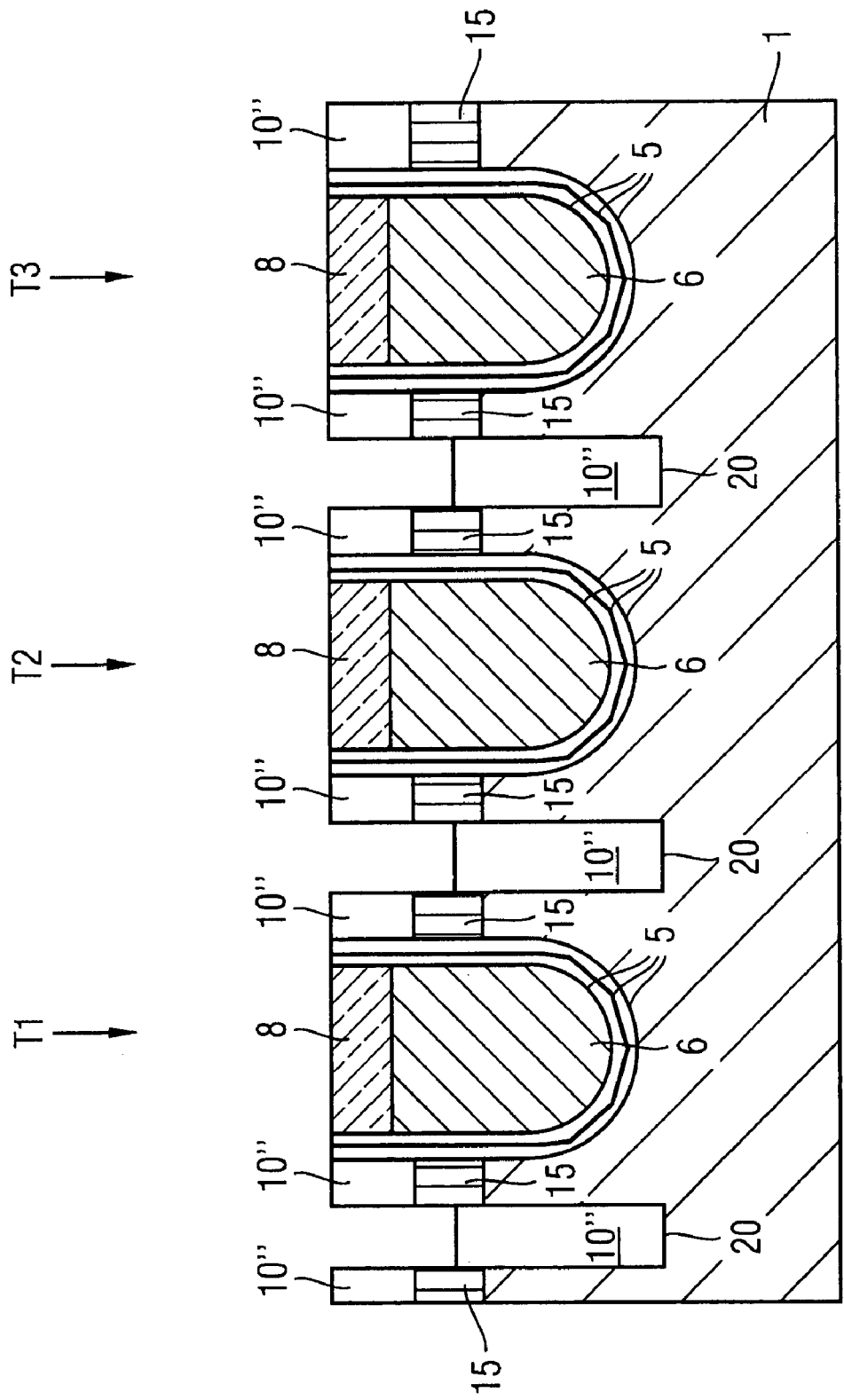

A TEOS oxide is then deposited over the entire structure to the thickness of the oxide spacers 10' and the oxide is etched back, the oxide being sunk in the isolation trenches 20 as filling 10" and oxide spacers 10" again being formed simultaneously on both sides of the u-MOSFETs T1, T2, T3, which finally leads to the process state shown in FIG. 1d.

Figure 1E:
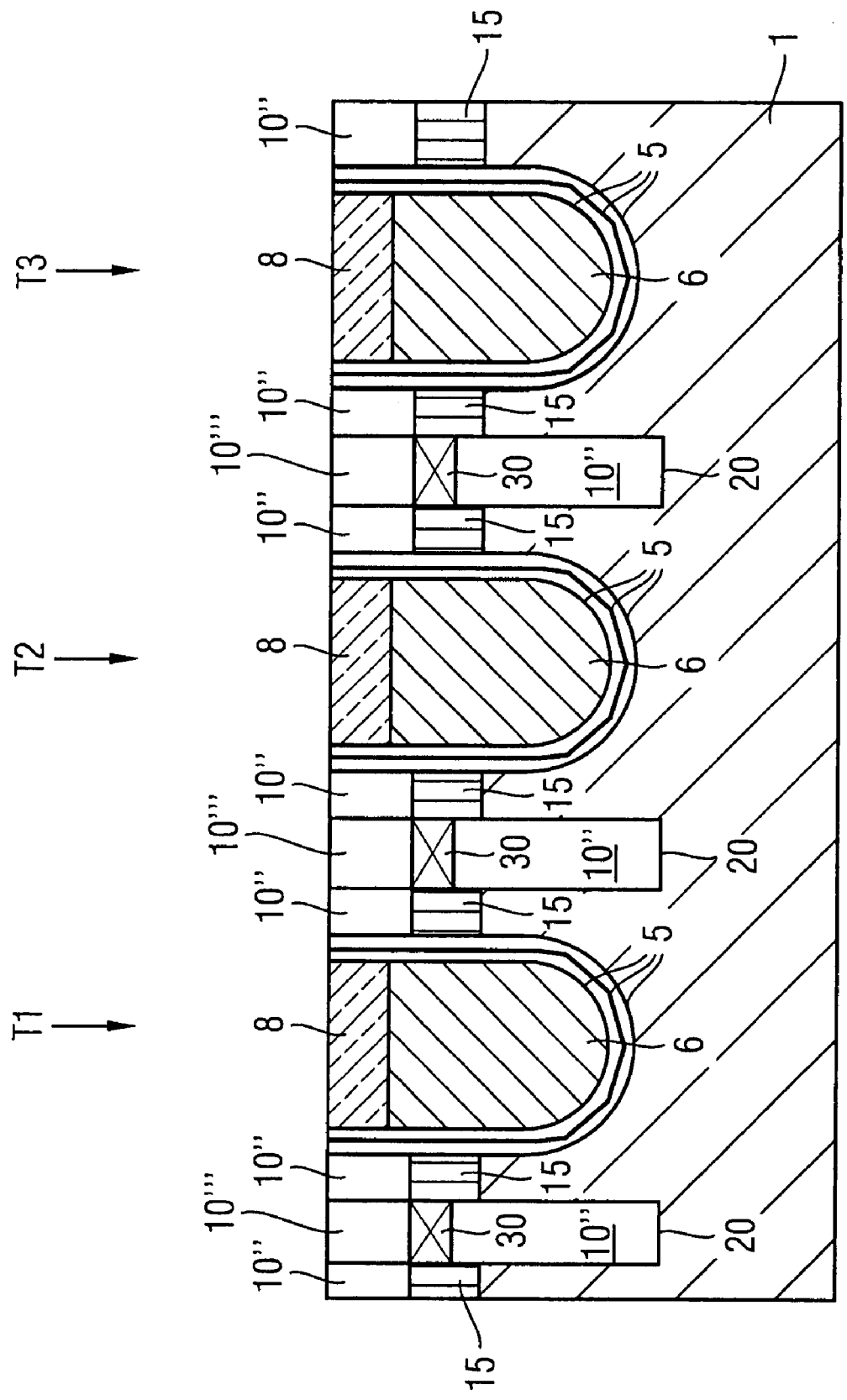
Figure 4:
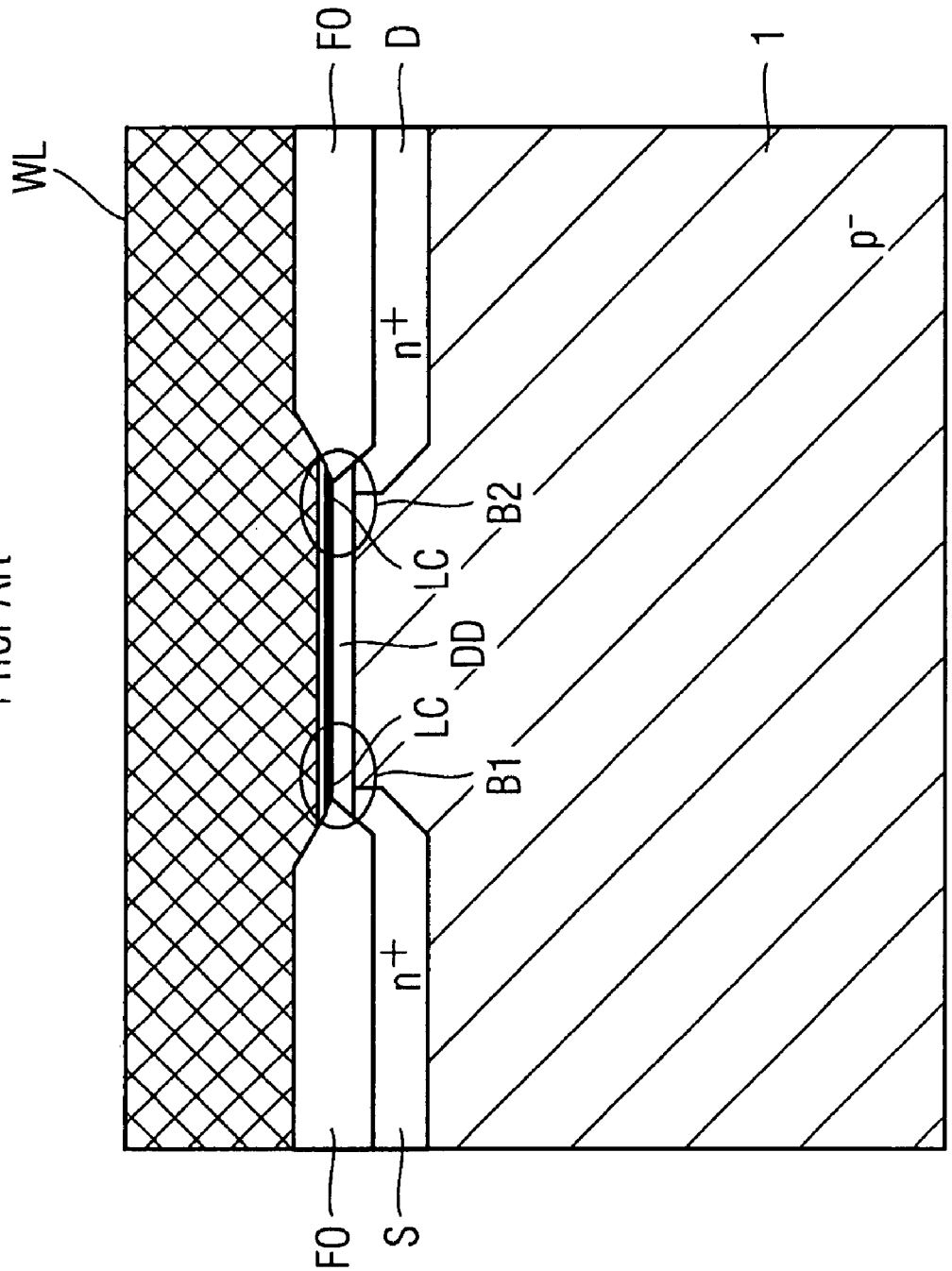
FIG. 4 shows a known NROM semiconductor memory device.
Figure 5:
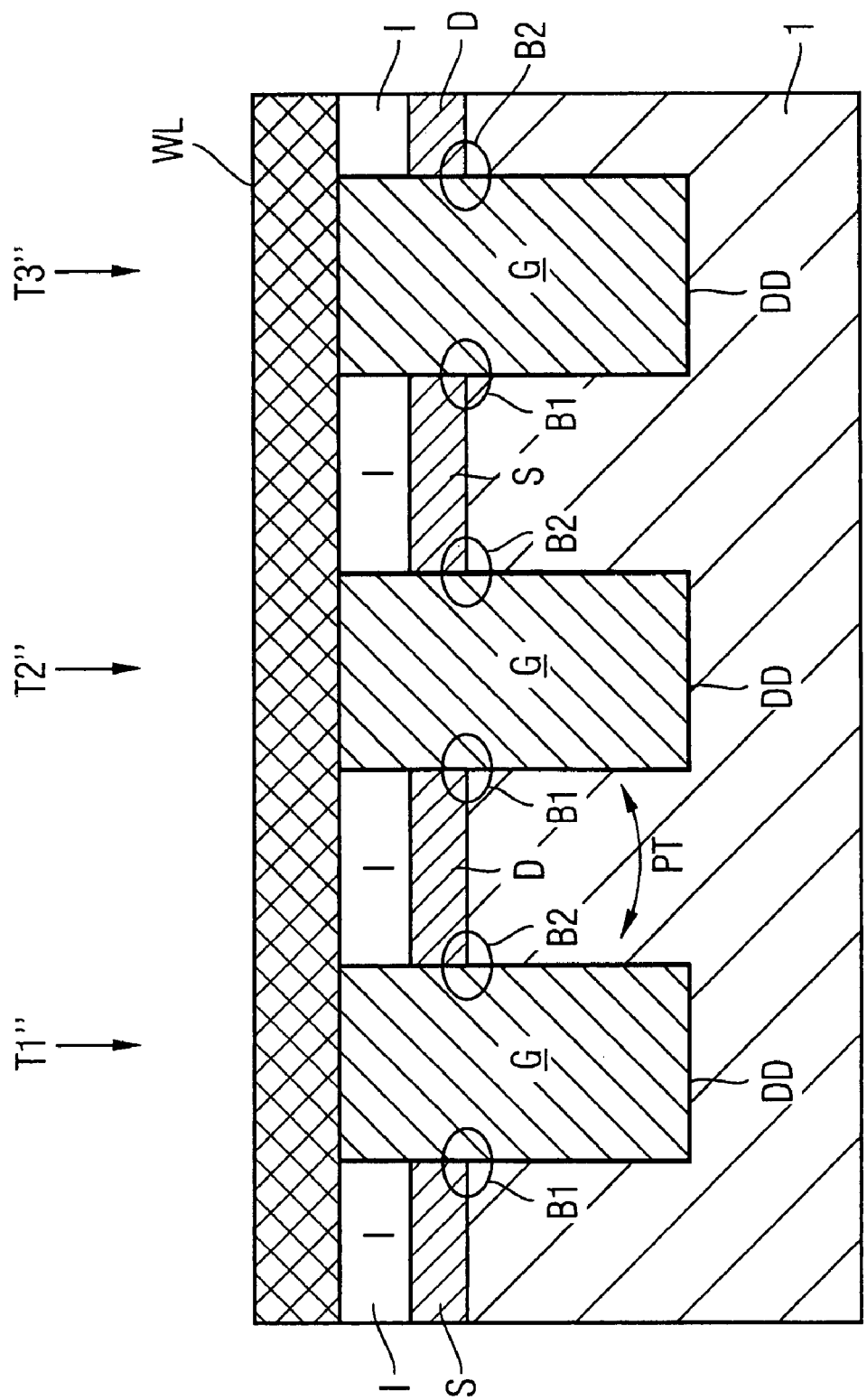
FIG. 5 shows another known an NROM semiconductor memory device.

With reference to FIG. 1e, conductive polysilicon is then deposited over the entire structure and is etched back in the isolation trenches 20 as far as the top side of the source/drain regions 15 after it has previously been subjected to chemical mechanical polishing back as far as the top side of the oxide spacers 10".

This is followed by deposition of a transition metal, for example Ti, Co or Ni, and then siliciding in order to produce conductive low-impedance strap regions 30 above the trench filling 10", said strap regions electrically connecting the source/drain regions 15 (which have previously been cut by the isolation trenches 20) to one another again.

Finally, a TEOS oxide is deposited again and polishing back is effected as far as the top side of the nitride regions 8 which close the isolation trenches 20 toward the top with covers 10'".

With reference to FIG. 2, it shall be mentioned that, in a subsequent process step (not shown), the transistors running in the Y-direction are cut, that is to say, in a photolithographic step, first of all the nitride cover 8, the polysilicon filling 6 and then the ONO triple dielectric 5 are removed between transistors which are adjacent in the Y-direction, with the result that, with reference to FIG. 2, the transistors T2 and T2a which are adjacent in the Y-direction are isolated by from one another as regards gate driving. The cavities produced by removing the polysilicon filling 6 and the ONO triple dielectric 5 are closed again by means of TEOS oxide filling and a subsequent CMP step in order to form isolation regions IT.

With reference to FIG. 1*f*, the oxide on the surface is then thickened by deposition, after which a photo-step is carried out in order to define the word lines (cf. WL1, WL2 in FIG. 2). In order to provide these word lines, first the oxide cover and then the nitride cover 8 are removed from the relevant u-MOSFETs T1, T2, T3 and the photoresist for the relevant photomask is then stripped.

Tungsten is then deposited over the entire area of the structure and is subjected to chemical mechanical polishing in order to produce the word lines WL1, WL2 etc. which are embedded in the oxide.

This results in the finished NROM semiconductor memory device shown in FIG. 1*f*.

FIG. 3 shows an NROM semiconductor memory device as a second embodiment of the present invention.

In the second embodiment shown in FIG. 3, T1', T2', T3' denote modified u-MOSFETs whose trenches do not have a rounded structure as in the first embodiment but rather an angular structure.

In order to avoid undesirable field strength effects at the lower corners of the transistor trenches, implantation with subsequent diffusion of n⁺-type ions is carried out after the transistor trenches have been produced (cf. FIG. 1*a*) in order to form channel blocking regions 50 in the semiconductor substrate 1 directly beneath the u-MOSFETs.

Although the present invention was described above with reference to a preferred exemplary embodiment, it is not restricted thereto but rather can be multifariously modified.

In particular, the selection of the layer materials and filling materials is only exemplary and can be varied in various ways.

Any multilayer dielectric that is suitable for charge trapping and not only the exemplary ONO dielectric can also be used as the dielectric.

LIST OF REFERENCE SYMBOLS

1 Silicon semiconductor substrate (p⁻)
2 Transistor trenches
5 ONO triple dielectric
6 Polysilicon gate
8 Nitride cover
10 Hard mask made of silicon oxide
T1,T2,T3;T2*a*;
T1',T2',T3'
T1",T2",T3" u-MOSFET
15 Source/drain regions (n⁺)
10',10''' Sidewall spacers made of silicon oxide or silicon nitride
3 Openings
20 Isolation trenches
10" Isolation trench filling made of silicon oxide
30 Conductive strap made of silicide
10''' Isolation trench cover made of silicon oxide
WL1,WL2;WL Word lines
IT Isolation region
BL1-BL4 Bit lines
50 Channel blocking region (n⁺)
S,D Source, drain (n⁺)
LC Charge accumulation region
DD ONO triple dielectric
B1,B2 Bits
FO Field oxide
I Isolation region
PT Punch-through
G Polysilicon gate

The invention claimed is:

1. A method for fabricating an NROM semiconductor memory device, said method having the steps of:
   (a) providing a plurality of u-shaped MOSFETs—which are spaced apart from one another and have a multilayer dielectric, which is suitable for charge trapping— along rows in a first direction and along columns in a second direction in trenches of a semiconductor substrate by carrying out the following steps:
      (a1) using a hard mask to form the trenches as longitudinal trenches corresponding to respective columns of u-shaped MOSFETs;
      (a2) forming the multilayer dielectric on the trenches walls;
      (a3) filling the trenches partially with a gate electrode material;
      (a4) closing the trenches with an insulation cover which is flush with the surface of the hard mask;
      (a5) removing the insulation cover, the gate electrode material and the multilayer dielectric from the trench walls and isolation regions are formed in order to separate the individual u-shaped MOSFETs along the columns;
   (b) providing source/drain regions between the u-shaped MOSFETs in interspaces between the rows which run parallel to the columns;
   (c) providing isolation trenches in the source/drain regions between the u-shaped MOSFETs of adjacent columns as far as a particular depth in the semiconductor substrate, said isolation trenches cutting the source/drain regions into respective bit lines;
   (d) filling the isolation trenches with an insulation material; and
   (e) providing word lines for connecting respective rows of u-shaped MOSFETs.

2. The method as claimed in claim 1, wherein the following steps are carried out:
   (a) forming openings in the hard mask in the interspaces in order to expose the semiconductor substrate, sidewall spacers remaining as a mask above the semiconductor substrate next to the trenches;
   (b) implanting ions through the openings and subsequent diffusion is carried out in order to form the source/drain regions;
   (c) etching the isolation trenches through the openings.

3. The method as claimed in claim 1, wherein the bit lines of adjacent MOSFETs are electrically connected in pairs by providing conductive straps in the isolation trenches.

4. The method as claimed in claim 1, wherein the trenches are rounded in the lower trench region before the multilayer dielectric is formed on the trench walls.

5. The method as claimed in claim 1, wherein the trenches are configured in an angular manner in the lower trench region, and, before the multilayer dielectric is formed on the trench walls, ions are implanted into the trenches using the hard mask and subsequent implantation is carried out in order to form channel blocking regions in the semiconductor substrate under the trenches.

\* \* \* \* \*